(12) United States Patent
Shen et al.

(10) Patent No.: US 8,110,928 B2
(45) Date of Patent: Feb. 7, 2012

(54) STACKED-TYPE CHIP PACKAGE STRUCTURE AND METHOD OF FABRICATING THE SAME

(75) Inventors: Chi-Chih Shen, Kaohsiung (TW); Cheng-Yin Lee, Tainan (TW); Wei-Chung Wang, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 247 days.

(21) Appl. No.: 12/237,035

(22) Filed: Sep. 24, 2008

(65) Prior Publication Data
US 2009/0091015 A1    Apr. 9, 2009

(30) Foreign Application Priority Data
Oct. 5, 2007    (TW) ................................ 96137457 A

(51) Int. Cl.
*H01L 23/48*    (2006.01)
*H01L 23/52*    (2006.01)
*H01L 29/40*    (2006.01)
(52) U.S. Cl. .................. 257/777; 257/778; 257/E23.128
(58) Field of Classification Search .................. 257/778, 257/777, E23.128
See application file for complete search history.

(56) References Cited

U.S. PATENT DOCUMENTS

| 5,942,798 | A | * | 8/1999 | Chiu | 257/737 |
| 7,169,642 | B2 | | 1/2007 | Karnezos | |
| 7,504,284 | B2 | * | 3/2009 | Ye et al. | 438/109 |
| 7,750,455 | B2 | * | 7/2010 | Pagaila et al. | 257/686 |
| 2006/0220209 | A1 | | 10/2006 | Karnezos et al. | |
| 2007/0187826 | A1 | * | 8/2007 | Shim et al. | 257/738 |

FOREIGN PATENT DOCUMENTS

| TW | I227553 | 2/2005 |
| TW | I236744 | 7/2005 |
| TW | I253151 | 4/2006 |

* cited by examiner

*Primary Examiner* — Jenny L Wagner
(74) *Attorney, Agent, or Firm* — J.C. Patents

(57) ABSTRACT

A stacked-type chip package structure including a first package structure, a second package structure, and a first molding compound is provided. The first package structure includes a first substrate, and a first chip stacked thereon and electrically connected thereto. The second package structure is stacked on the first package structure, and includes a second substrate, a second chip, and a plurality of solder blocks. The second chip is electrically connected to the second substrate, and the second substrate is electrically connected to the first substrate. The second chip is fixed on the first chip through an adhesive layer. The solder blocks are disposed on the back of the second substrate. The first molding compound is disposed on the first substrate and encapsulates the first package structure and the second package structure. The first molding compound has a recess for exposing the solder blocks.

10 Claims, 5 Drawing Sheets

STACKED-TYPE CHIP PACKAGE STRUCTURE AND METHOD OF FABRICATING THE SAME

CROSS-REFERENCE TO RELATED APPLICATION

This application claims the priority benefit of Taiwan application serial no. 96137457, filed on Oct. 5, 2007. The entirety of the above-mentioned patent application is hereby incorporated by reference herein and made a part of specification.

BACKGROUND OF THE INVENTION

1. Field of the Invention

The present invention relates to a chip package structure and a method of fabricating the same, and in particular, to a stacked-type chip package structure and a method of fabricating the same.

2. Description of Related Art

In the contemporary information world, consumers continuously pursue electronic apparatuses with higher speed, better quality and more functions. For the product outlook, an electronic apparatus is required to be lighter, thinner, shorter and smaller. To achieve the above-mentioned objectives, many manufacturers introduce the concept of systematization into a circuit design to reduce the number of chips disposed in an electronic product. In addition, in terms of the electronic package technique, in order to adapt with the trend of being lighter, thinner, shorter and smaller, various package design concepts such as a multi-chip module (MCM), a chip scale package (CSP) and a stacked-type multi-chip package structure have also been developed.

FIG. 1 is a schematic cross-sectional view of a conventional fan-in stacked-type chip package structure. As shown by FIG. 1, a stacked-type chip package structure 100 mainly includes a first package structure 110, a second package structure 120, a molding compound 130 and a third package structure 140. The first package structure 110 includes a first substrate 112 and a first chip 114 stacked thereon and electrically connected thereto. The second package structure 120 also includes a second substrate 122 and a second chip 124 stacked thereon and electrically connected thereto. As shown by FIG. 1, the second package structure 120 is disposed upside down on the first package structure 110, and the second substrate 122 is electrically connected to the first substrate 112 through a plurality of bonding wires 150. The molding compound 130 is disposed on the first substrate 112 to encapsulate the first package structure 110 and the second package structure 120. The molding compound 130 has a recess 132 to partially expose the second substrate 122. The third package structure 140 includes a third substrate 142 and a third chip 144 stacked thereon and electrically connected thereto. The third package structure 140 is stacked on the second package structure 120 and electrically connected to the second substrate 122 through a plurality of solder balls 152.

In the stacked-type chip package structure 100, because the back of the second substrate 122 is not coated with solder paste nor has the solder balls implanted thereon in advance for being connected with the solder balls 152 of the third package structure 140. Therefore, in a high temperature reflow process, a desirable good connection between the second substrate 122 and the third substrate 142 is often not obtainable due to the warped substrate, and thus the production yield is decreased.

Furthermore, in the above-mentioned process of fabricating the stacked-type chip package structure 100, to form the molding compound 130 encapsulating the first package structure 110 and the second package structure 120, a special mold is required in the molding process, so as to form the recess 132 on the second substrate 122. However, the size of the recess 132 varies with the size of the third package structure 140. Therefore, when the size of the third package structure 140 is changed, it is required to replace the original mold with a different mold or to modify the original mold, in order to proceed the molding process, so that the recess 132 with the desired size can be formed on the second substrate 122.

However, whether to make a new mold or modify the original mold, the cost for fabricating the stacked-type chip package structure and the process time will be substantially increased. Therefore, how to utilize the same mold to fabricate the molding compound that fits to different chip sizes is a primary problem that needs to be solved urgently.

SUMMARY OF THE INVENTION

The present invention is directed to a stacked-type chip package structure and a method of fabricating the same. The method of fabricating the stacked-type chip package structure utilizes a standardized mold to fabricate a molding compound encapsulating the first package structure and the second package structure in the stacked-type chip package structure. Then, a recess with a desired size is formed on the molding compound through a polishing process or other methods. Thereby, the present invention can prevent problems which are existing in prior arts, i.e. remaking molds or modifying molds due to different chip sizes.

In order to achieve the above-mentioned or other objectives, the present invention provides a stacked-type chip package structure including a first package structure, a second package structure and a first molding compound. The first package structure includes a first substrate and a first chip. The first substrate has a first surface and a second surface. The first chip is disposed on the first surface of the first substrate and electrically connected to the first substrate. The second package structure is stacked on the first package structure and includes a second substrate, a second chip and a plurality of solder blocks. The second substrate has a third surface and a fourth surface and is electrically connected to the first substrate. The second chip is disposed on the third surface of the second substrate and electrically connected to the second substrate, wherein the second chip is fixed on the first chip through an adhesive layer. A plurality of solder blocks is disposed on the fourth surface of the second substrate. The first molding compound is disposed on the first substrate and encapsulates the first package structure and the second package structure, wherein the first molding compound has a recess for exposing the solder blocks.

According to one embodiment of the present invention, the first package structure further includes a plurality of first bumps, so that the first chip is electrically connected to the first substrate through the first bumps.

According to one embodiment of the present invention, the first package structure further includes a first underfill. The first underfill is disposed between the first chip and the first substrate and encapsulates the first bumps.

According to one embodiment of the present invention, the second package structure further comprises a plurality of second bumps, so that the second chip is electrically connected to the second substrate through the second bumps.

According to one embodiment of the present invention, the second package structure further includes a second underfill.

The second underfill is disposed between the second chip and the second substrate and encapsulates the second bumps.

According to one embodiment of the present invention, the stacked-type chip package structure further comprises a plurality of bonding wires connected between the first substrate and the second substrate.

According to one embodiment of the present invention, the stacked-type chip package structure further comprises a third package structure disposed in the recess of the first molding compound. The third package structure comprises a third substrate, a third chip and a plurality of solder balls. The third substrate has a fifth surface and a sixth surface. The third chip is disposed on the fifth surface of the third substrate and electrically connected to the third substrate. The solder balls are disposed on the sixth surface of the third substrate and respectively connected to the corresponding solder blocks, so that the third package structure is electrically connected to the second package structure through the solder balls and the solder blocks.

According to one embodiment of the present invention, the third chip is electrically connected to the third substrate through a wire bonding technique or a flip-chip bonding technique.

According to one embodiment of the present invention, the third package structure further includes a second molding compound. The second molding compound is disposed on the third substrate and encapsulates the third chip.

According to one embodiment of the present invention, the stacked-type chip package structure further includes a plurality of solder balls disposed on the second surface of the first substrate.

In order to achieve the above-mentioned and other objectives, the present invention further provides a method of fabricating a stacked-type chip package structure, which includes steps as follows. First, a first package structure and a second package structure are provided. The first package structure includes a first substrate and a first chip. The first substrate has a first surface and a second surface. The first chip is disposed on the first surface of the first substrate and electrically connected to first substrate. The second package structure includes a second substrate, a second chip and a plurality of first solder balls. The second substrate has a third surface and a fourth surface. The second chip is disposed on the third surface of the second substrate and electrically connected to the second substrate. The first solder balls are disposed on the fourth surface of the second substrate. Then, the second package structure is turned upside down and stacked on the first package structure, and the second chip is fixed on the first chip. Next, the second substrate is electrically connected to the first substrate. After that, a first molding compound is formed on the first substrate of the first package structure, so that the first molding compound encapsulates the first package structure and the second package structure. Finally, the first molding compound on the second package structure and each of the first solder balls are partially removed, so that a recess is formed on the first molding compound, and each of the first solder balls forms a solder block.

According to one embodiment of the present invention, the first package structure further comprises a plurality of first bumps, so that the first chip is electrically connected to the first substrate through the first bumps.

According to one embodiment of the present invention, the first package structure further comprises a first underfill disposed between the first chip and the first substrate and encapsulating the first bumps.

According to one embodiment of the present invention, the second package structure further comprises a plurality of second bumps, so that the second chip is electrically connected to the second substrate through the second bumps.

According to one embodiment of the present invention, the second package structure further includes a second underfill disposed between the second chip and the second substrate and encapsulating the second bumps.

According to one embodiment of the present invention, after providing the first package structure and the second package structure, the method of fabricating the stacked-type chip package structure further includes forming an adhesive layer on the first chip of the first package structure, so that the second chip is fixed on the first chip through the adhesive layer.

According to one embodiment of the present invention, a method of electrically connecting the second substrate to the first substrate includes a wire bonding technique or a flip-chip bonding technique.

According to one embodiment of the present invention, a method of partially removing the first molding compound on the second package structure and each of the first solder balls includes performing a polishing process, a laser cutting process or a chemical etching process.

According to one embodiment of the present invention, after partially removing the first molding compound on the second package structure and each of the first solder balls, the method of fabricating the stacked-type chip package structure further includes steps as follows. First, a third package structure is provided. The third package structure includes a third substrate, a third chip and a plurality of second solder balls. The third substrate has a fifth surface and a sixth surface. The third chip is disposed on the fifth surface of the third substrate and electrically connected to the third substrate. The solder balls are disposed on the sixth surface of the third substrate. Then, the third package structure is disposed in the recess of the first molding compound, and each of the second solder balls and the corresponding solder block are fused, so that the third package structure is electrically connected to the second package structure through the second solder balls and the solder blocks.

According to one embodiment of the present invention, the third chip is electrically connected to the third substrate through a wire bonding technique or a flip-chip bonding technique.

According to one embodiment of the present invention, the third package structure further includes a second molding compound disposed on the third substrate and encapsulating the third chip.

According to one embodiment of the present invention, the method of fabricating the stacked-type chip package structure further comprises forming a plurality of third solder balls on the second surface of the first substrate.

According to the present invention, the stacked-type chip package structure and the method of fabricating the same mainly utilize a standardized mold to fabricate a molding compound disposed on the first substrate and encapsulating the first package structure and the second package structure. Then, the first molding compound is partially removed according to the size of the package structure to be stacked thereon, so as to fabricate the recess with the desired size. After that, the third package structure is stacked in the recess and electrically connected to the second package structure. Thereby, the present invention can prevent problems which are existing in prior arts, i.e. remaking molds or modifying molds due to different chip sizes.

Furthermore, in the process of partially removing the molding compound, the first solder balls partially remain to serve as the solder blocks. Therefore, when the second solder balls and the corresponding solder blocks are fused subsequently, the second solder balls are easily connected to the corresponding solder blocks. Thus, the effect resulted from the warped substrate is reduced, and the stacked-type chip package structure is manufactured with higher production yield.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate the embodiments of the invention and, together with the description, serve to explain the principles of the invention.

DESCRIPTION OF EMBODIMENTS

Figure 1:
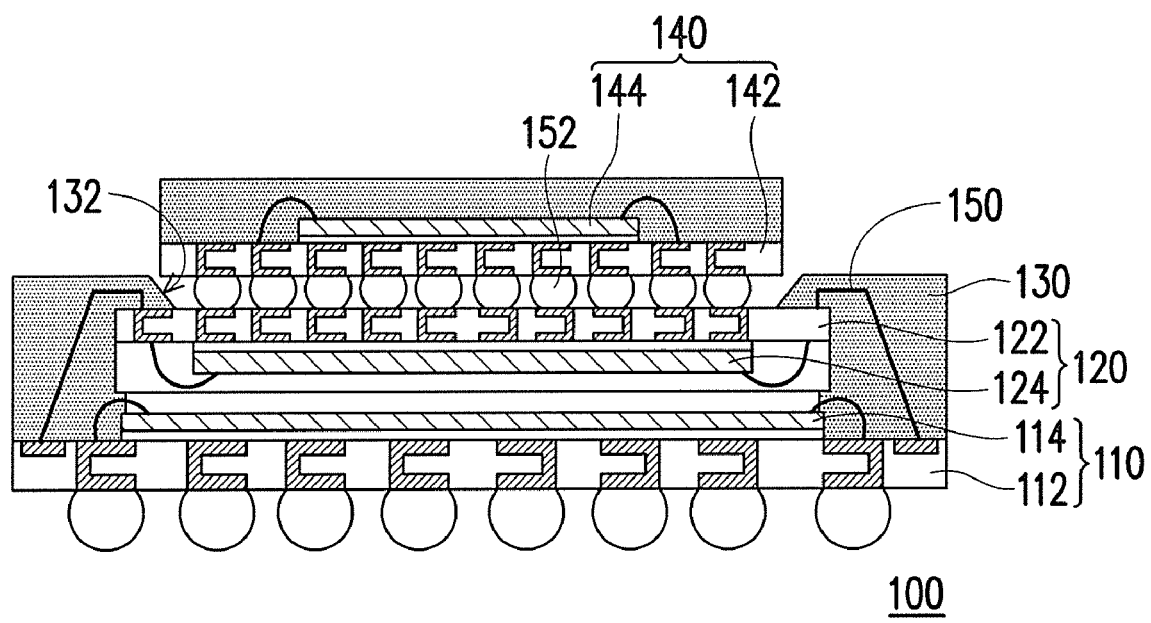
FIG. 1 is a schematic cross-sectional view of a conventional fan-in stacked-type chip package structure.
Figure 2A:
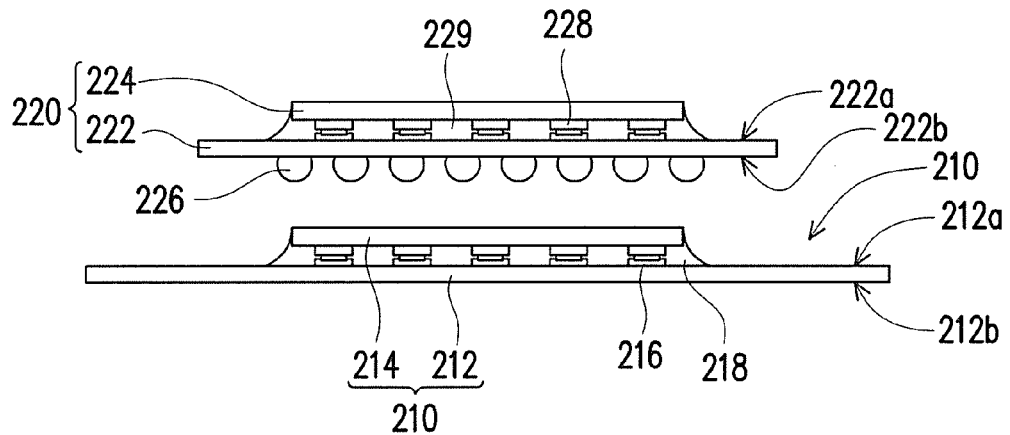
FIGS. 2A through 2H are schematic cross-sectional views illustrating a process of fabricating a stacked-type chip package structure according to one embodiment of the present invention.

FIGS. 2A through 2H are schematic cross-sectional views illustrating a process of fabricating a stacked-type chip package structure according to one embodiment of the present invention. First, referring to FIG. 2A, a first package structure 210 and a second package structure 220 are provided. The first package structure 210 includes a first substrate 212 and a first chip 214. The first substrate 212 has a first surface 212a and a corresponding second surface 212b. The first chip 214 is disposed on the first surface 212a of the first substrate 212 and electrically connected to the first substrate 212. In the embodiment, the first chip 214 is electrically connected to the first substrate 212 through a plurality of first bumps 216. However, the first chip 214 can be electrically connected to the first substrate 212 through other methods, which is not limited by the present invention herein. Furthermore, in order to prevent the first bumps 216 from damage and humidity, the first package structure 210 can further include a first underfill 218. The first underfill 218 is filled between the first chip 214 and the first substrate 212 and encapsulates the first bumps 216 to protect the first bumps 216 from damage and humidity. As shown by FIG. 2A, the second package structure 220 includes a second substrate 222, a second chip 224 and a plurality of first solder balls 226. The second substrate 222 has a third surface 222a and a fourth surface 222b. The second chip 224 is disposed on the third surface 222a of the second substrate 222 and electrically connected to the second substrate 222. The first solder balls 226 are disposed on the fourth surface 222b of the second substrate 222. In the embodiment, the second chip 224 is electrically connected to the second substrate 222 through a plurality of second bumps 228. However, the second chip 224 can be electrically connected to the second substrate 222 through other methods, which is not limited by the present invention herein. Furthermore, in order to prevent the second bumps 228 from damage and humidity, the second package structure 220 can further include a second underfill 229. The second underfill 229 is filled between the second chip 224 and the second substrate 222 and encapsulates the second bumps 228 to prevent the second bumps 228 from damage and humidity.

Figure 2B:
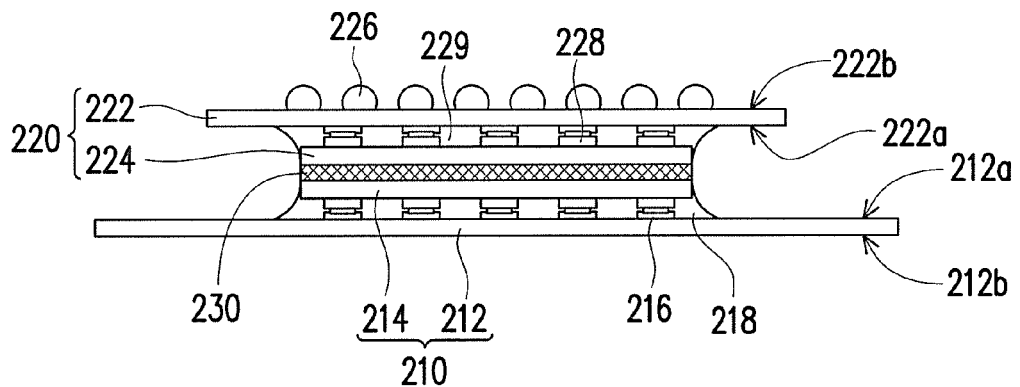

Then, referring to FIG. 2B, the second package structure 220 is turned upside down and stacked on the first package structure 210, and the second chip 224 is fixed on the first chip 214. As shown by FIG. 2B, the second chip 224 can be fixed on the first chip 214 by forming an adhesive layer 230 on the first chip 214 of the first package structure 210, so as to fix the second chip 224 on the first chip 214 through the adhesive layer 230. However, the second chip 224 can be fixed on the first chip 214 through other methods, which is not limited by the present invention herein.

Figure 2C:
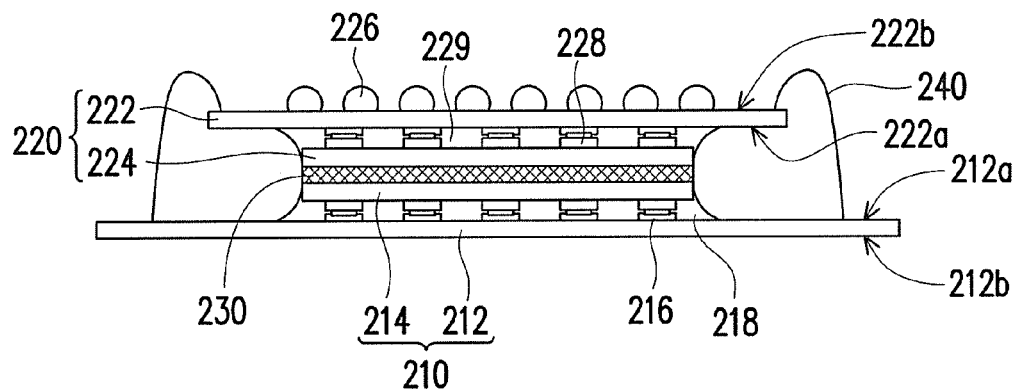

Next, as shown by FIG. 2C, the second substrate 222 is electrically connected to the first substrate 212. In the embodiment, a wire bonding technique is utilized to form a plurality of bonding wires 240 between the second substrate 222 and the first substrate 212, so that the second substrate 222 is electrically connected to the first substrate 212 through the bonding wires 240. However, the second substrate 222 can be electrically connected to the first substrate 212 through a flip-chip bonding technique or other methods, which is not limited by the present invention herein.

Figure 2D:
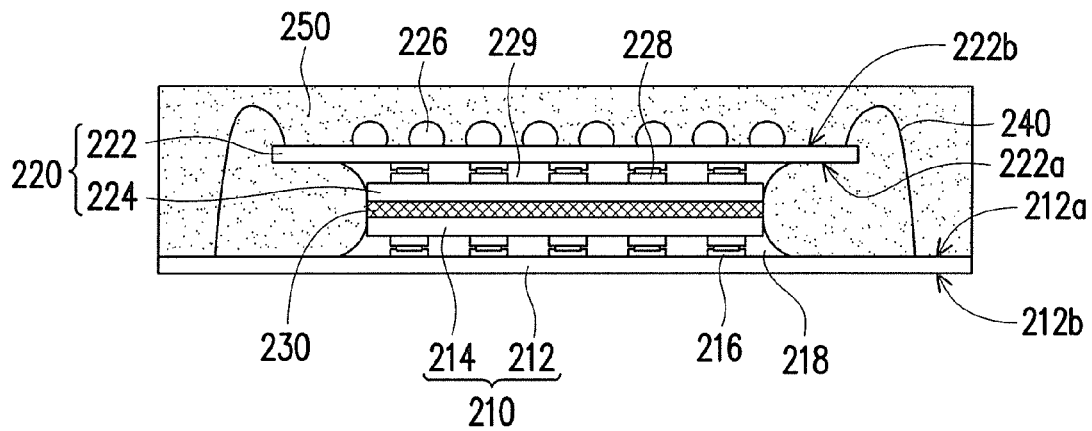

After that, referring to FIG. 2D, a first molding compound 250 is formed on the first substrate 212 of the first package structure 210 to encapsulate the first package structure 210 and the second package structure 220, and thereby the first molding compound 250 protects the first package structure 210 and the second package structure 220 from damage and humidity. In this step, a standardized mold (a mold used for mass production) is used for molding, and therefore it is unnecessary to use different molds for chips with different sizes.

Figure 2E:
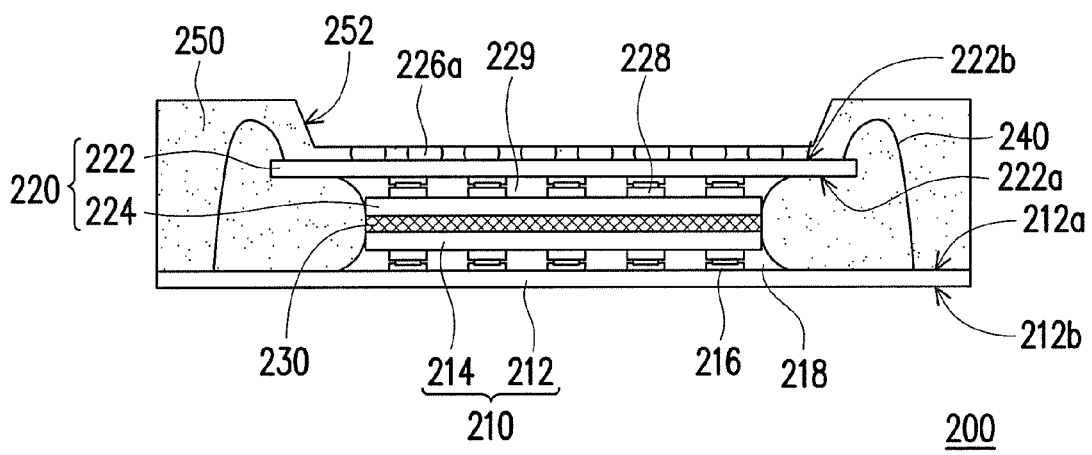

Finally, referring to FIG. 2E, the first molding compound 250 of the second package structure 220 and each of the first solder balls 226 are partially removed to form a recess 252 on the first molding compound 250. The recess 252 exposes each of the first solder balls 226, so that each of the first solder balls 226 can form a solder block 226a. As shown by FIG. 2E, the recess 252 formed in the first molding compound 250 can be used to carry other package structures, and the solder blocks 226a can serve as connecting points for electrically connecting the second package structure 220 to other package structures. In this step, the recess 252 with the desired size can be manufactured by changing a polishing area of the first molding compound 250 according to the size of the package structure to be stacked on the recess 252 in a subsequent process. Moreover, according to one embodiment of the present invention, the first molding compound 250 on the second package structure 220 and each of the first solder balls 226 can be partially removed by performing a polishing process, a laser cutting process, a chemical etching process, and etc. The above-mentioned is merely exemplary and not intended to limit the present invention. Up to this point, the process of fabricating the stacked-type chip package structure 200 is completed.

After the stacked-type chip package structure 200 shown in FIG. 2E is fabricated, generally, another package structure may be stacked in the recess 252 of the first molding compound 250 to form a package structure with multiple chips disposed in a stacked manner. A method of stacking another package structure in the recess 252 of the first molding compound 250 is illustrated below accompanied with the drawings.

Figure 2F:
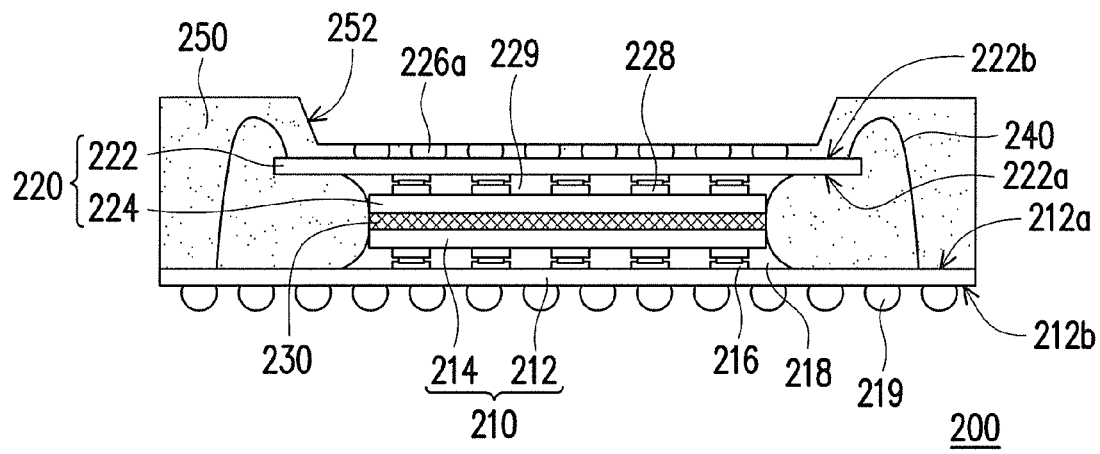
Figure 2G:
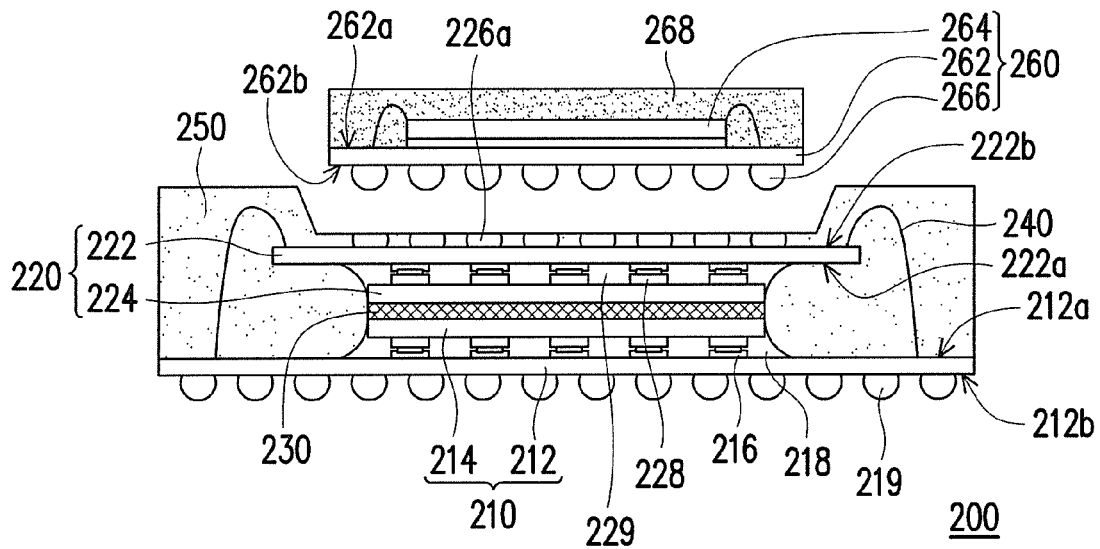

Referring to FIG. 2F, after the step shown by FIG. 2E is completed, a plurality of third solder balls 219 can be selectively formed on the second surface 212b of the first substrate 212 to serve as a medium for electrically connecting the whole stacked-type chip package structure 200 to other electronic products. After that, referring to FIG. 2G, a third package structure 260 is provided. The third package structure 260 includes a third substrate 262, a third chip 264 and a plurality of second solder balls 266. The third substrate 262 has a fifth surface 262a and a sixth surface 262b. The third chip 264 is disposed on the fifth surface 262a of the third substrate 262 and electrically connected to the third substrate 262. The second solder balls 266 are disposed on the sixth surface 262b of the third substrate 262. In this embodiment, the third chip 264 is electrically connected to the third substrate 262 through the wire bonding technique. However, the third chip 264 can be electrically connected to the third substrate 262 through other methods (e.g. the flip-chip bonding technique), which is not limited by the present invention herein. Furthermore, in order to protect the third chip 264 as well as the bonding wires connected between the third chip 264 and the third substrate 262 from damage and humidity, the third package structure 260 can further include a second molding compound 268 disposed on the third substrate 262 and encapsulating the third chip 264, so as to protect the third chip 264 and the bonding wires from damage and humidity.

Figure 2H:
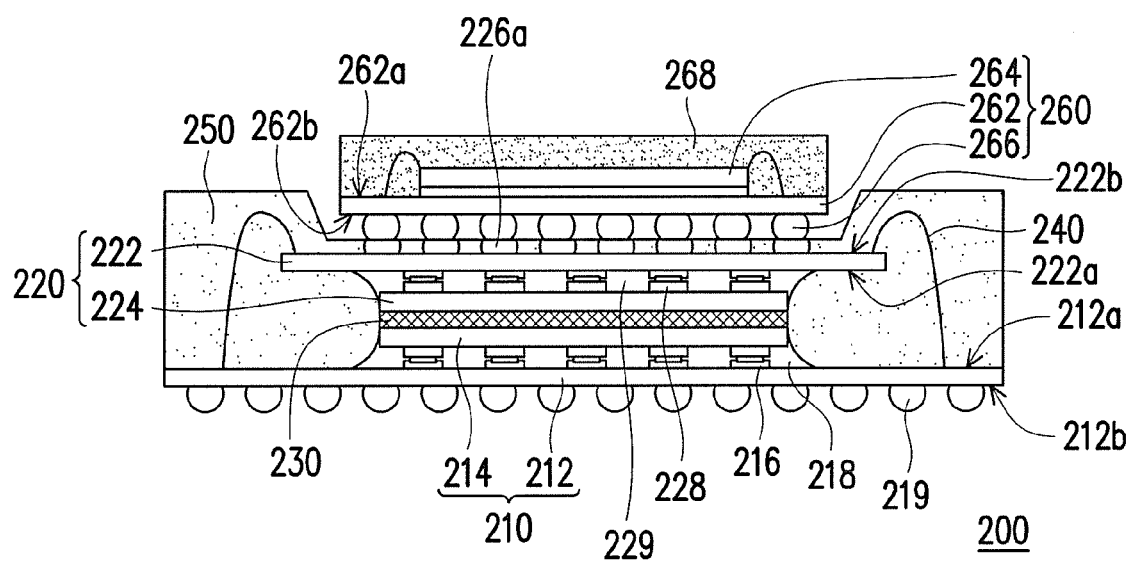

Finally, referring to FIG. 2H, the third package structure 260 is disposed in the recess 252 of the first molding compound 250, and the second solder balls 266 and the corresponding solder block 226a are fused, so that the third package structure 260 is electrically connected to the second package structure 220 through the second solder balls 266 and the solder blocks 226a. Because in the step of partially removing the first molding compound 250, the first solder balls 266 partially remain to serve as the solder blocks 226a. Therefore, in a high temperature reflow process, the second solder balls 266 are easily connected to the corresponding solder blocks 226a, so that the chip package structure formed by stacking has higher production yield, and thus the effect resulted from the warped substrate can be reduced.

In summary, according to the present invention, the stacked-type chip package structure and the method of fabricating the same mainly utilize a standardized mold (i.e., a mold used for mass production) to fabricate a molding compound encapsulating the first package structure and the second package structure in the stacked-type chip package structure. Then, according to the size of the package structure to be stacked on the recess in the subsequent process, the recess with the desired size is fabricated by performing the polishing process or other methods to partially remove the molding compound. Thereby, the present invention can prevent problems which are existing in the molding process of prior arts, i.e. remaking molds or modifying molds due to different chip sizes.

Furthermore, in the process of partially removing the molding compound, the first solder balls partially remain to serve as the solder blocks. Therefore, when the second solder balls and the corresponding solder blocks are fused subsequently, the second solder balls are easily connected to the corresponding solder blocks. Thus, the effect resulted from the warped substrate is reduced, and the stacked-type chip package structure is manufactured with higher production yield.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A stacked-type chip package structure, comprising:
a first package structure, comprising:
a first substrate having a first surface and a second surface; and
a first chip disposed on the first surface of the first substrate and electrically connected to the first substrate; and
a second package structure stacked on the first package structure, comprising:
a second substrate having a third surface and a fourth surface and electrically connected to the first substrate;
a second chip disposed on the third surface of the second substrate and electrically connected to the second substrate, wherein an adhesive layer is in direct contact with the first chip and the second chip; and
a plurality of solder blocks disposed on the fourth surface of the second substrate; and
a first molding compound disposed on the first substrate and encapsulating the first package structure and the second package structure, wherein the first molding compound has a recess and a bottom surface of the recess is coplanar with top surfaces of the solder blocks, and the first molding compound that encloses and fills between the solder blocks is located between the top surfaces of the solder blocks and the fourth surface of the second substrate.

2. The stacked-type chip package structure according to claim 1, wherein the first package structure further comprises a plurality of first bumps, and thereby the first chip is electrically connected to the first substrate through the first bumps.

3. The stacked-type chip package structure according to claim 2, wherein the first package structure further comprises a first underfill disposed between the first chip and the first substrate and encapsulating the first bumps.

4. The stacked-type chip package structure according to claim 1, wherein the second package structure further comprises a plurality of second bumps, and thereby the second chip is electrically connected to the second substrate through the second bumps.

5. The stacked-type chip package structure according to claim 4, wherein the second package structure further comprises a second underfill disposed between the second chip and the second substrate and encapsulating the second bumps.

6. The stacked-type chip package structure according to claim 1, further comprising a plurality of bonding wires connected between the first substrate and the second substrate.

7. The stacked-type chip package structure according to claim 1, further comprising a third package structure disposed in the recess of the first molding compound, the third package structure comprising:
a third substrate having a fifth surface and a sixth surface;
a third chip disposed on the fifth surface of the third substrate and electrically connected to the third substrate; and
a plurality of solder balls disposed on the sixth surface of the third substrate and respectively connected to the corresponding solder block, and thereby the third package structure is electrically connected to the second package structure through the solder balls and the solder blocks.

8. The stacked-type chip package structure according to claim 7, wherein the third chip is electrically connected to the third substrate through a wire bonding technique or a flip-chip bonding technique.

9. The stacked-type chip package structure according to claim 7, wherein the third package structure further comprises a second molding compound disposed on the third substrate and encapsulating the third chip.

10. The stacked-type chip package structure according to claim 1, further comprising a plurality of solder balls disposed on the second surface of the first substrate.

* * * * *